United States Patent [19]

Debe

[11] Patent Number: 5,039,561
[45] Date of Patent: Aug. 13, 1991

[54] METHOD FOR PREPARING AN ARTICLE HAVING SURFACE LAYER OF UNIFORMLY ORIENTED, CRYSTALLINE, ORGANIC MICROSTRUCTURES

[75] Inventor: Mark K. Debe, Stillwater, Minn.

[73] Assignee: Minnesota Mining and Manufacturing Company, St. Paul, Minn.

[21] Appl. No.: 271,930

[22] Filed: Nov. 14, 1988

Related U.S. Application Data

[62] Division of Ser. No. 899,653, Aug. 25, 1986, Pat. No. 4,812,352.

[51] Int. Cl.$^5$ ................... C23C 16/00; C23C 16/56
[52] U.S. Cl. ................... 427/255.6; 204/192.14; 204/192.26; 427/160; 427/162; 427/255.7; 427/384; 427/385.5; 427/404; 427/407.1
[58] Field of Search ................... 427/160, 255.7, 162, 427/255, 166, 256, 255.6, 384, 385.5, 394, 404, 402, 407.1, 405, 409, 412.3; 428/142, 143, 221, 323, 336, 338, 357, 461, 500, 688; 430/56, 128; 204/192.14, 192.15, 192.26, 192.27, 192.28

[56] References Cited

U.S. PATENT DOCUMENTS

| | | | |
|---|---|---|---|
| 3,862,127 | 1/1975 | Miller | 540/122 |
| 3,932,180 | 1/1976 | Griffiths et al. | 427/384 |
| 4,123,267 | 10/1978 | Dorer | 430/65 |
| 4,148,294 | 4/1979 | Scherber et al. | 126/270 |
| 4,155,781 | 5/1979 | Diepers | 437/2 |
| 4,190,321 | 2/1980 | Dorer et al. | 350/165 |
| 4,209,008 | 6/1980 | Lemkey et al. | 126/452 |
| 4,252,843 | 2/1981 | Dorer | 427/162 |
| 4,252,865 | 2/1981 | Gilbert et al. | 428/611 |
| 4,340,276 | 7/1982 | Maffitt et al. | 350/164 |
| 4,396,643 | 8/1983 | Kuehn et al. | 427/160 |
| 4,563,300 | 1/1986 | Wynne et al. | 252/518 |
| 4,563,301 | 1/1986 | Marks et al. | 252/519 |

FOREIGN PATENT DOCUMENTS

66-11752  1/1961  Japan .

OTHER PUBLICATIONS

Application of Surface Science, vol. 14, 1982–1983, pp. 1–40, North-Holland Publishing Co., Amsterdam, NL, M. K. Debe, "Organic/Metal Interface Studies with Reflection-Absorption Infrared Spectroscopy: Photomasked Surfactants and Organic Photoconductors on Aluminum".

O. Hirabaru, T. Nakashima, H. Shirai, "Thermanl Behavior of Thin Copper-Phthalocyanin Films, Vacuum", (Japan), 22(7) (1979) 273.

Lee and Debe, "Measurement and Modeling of the Reflectance-Reducing Properties of Gradient Index Microstructured Surfaces", Photographic Science and Engineering, vol. 24, No. 4, Jul./Aug. 1980, pp. 211–216.

H. G. Craighead, R. E. Howard, J. E. Sweeney, D. M. Tennant, "Textured Surfaces: Optical Storage and Other Applications", J. Vac. Sci. Technol., 20(3), Mar. 1982.

Debe, "The Interface Orientation of Perylene Red and Phthalocyanine Molecules Vapor Deposited on Aluminum", J. Vac. Sci. Technol., 21(1), May/Jun. 1982.

Debe, "Extracting Physical Structure Information from Thin Organic Films with Reflection Absorption Infrared Spectroscopy", J. Appl. Phys. 55(9), May 1, 1984.

Primary Examiner—Sadie Childs
Attorney, Agent, or Firm—Donald M. Sell; Walter N. Kirn; David L. Weinstein

[57] ABSTRACT

Method of preparing an article comprising a substrate bearing a microlayer which comprises uniformly oriented, crystalline, solid, organic microstructures. The microstructures may be mono- or polycrystalline. In the preferred embodiment, the microstructures are of uniform shape and size. The articles can be prepared by (1) vapor-depositing an organic compound as a thin, continuous film onto a substrate to provide a composite, and (2) annealing the composite in a vacuum sufficiently to induce a physical change in the original deposited film to form the microstructures. The microlayer can be overcoated with other materials to provide desired properties to the article. Articles of this invention are useful for many forms of light trapping, energy absorption, imaging, data transmission and storage, and gradient index applications.

3 Claims, 7 Drawing Sheets

METHOD FOR PREPARING AN ARTICLE HAVING SURFACE LAYER OF UNIFORMLY ORIENTED, CRYSTALLINE, ORGANIC MICROSTRUCTURES

This is a division of application Ser. No. 899,653 filed Aug. 25, 1986 now U.S. Pat. No. 4,812,352.

TECHNICAL FIELD

This invention relates to articles having microstructured surfaces.

BACKGROUND OF THE INVENTION

Microstructured surfaces have been prepared by many different types of chemical and physical deposition processes. These processes are conveniently categorized as "wet chemical" processes and "dry chemical" processes. An example of a wet chemical process involves exposure of aluminum, magnesium, or zinc metal film or alloy thereof to saturated steam or an aqueous oxidizing solution to form an oxyhydroxide boehmite microstructured surface (see U.S. Pat. Nos. 4,123,267; 4,190,321; 4,252,843; 4,396,643). An example of a dry chemical process involves production of thread-like, non-uniform, mosaic structures of randomly oriented alpha- and beta-copper phthalocyanine crystallites by annealing, in air, films of copper phthalocyanine that had been vapor deposited in vacuum on glass and potassium chloride substrates, or by vapor deposition of copper phthalocyanine on a heated substrate (see "Thermal Behavior of Thin Copper - Phthalocyanin Films", O. Hirabaru, T. Nakadhima, H. Shirai, Vacuum (Japan) 22(7) (1979) 273).

In most applications of the aforementioned wet chemical and dry chemical) processes, the microstructured surfaces are generally made of metallic or inorganic materials only. In addition, the microstructured surface comprises a polycrystalline or amorphous material, not single crystalline material.

Microstructured surfaces currently in use and the processes used to make them have one or more shortcomings. Some have wide variation in the size distribution or aspect ratio of the microstructure. This variation renders the properties of the microstructured surface difficult to specify, making the surface a poor candidate for optical uses such as absorption or reflectivity. Some microstructures are peculiar to specific substrates, many of which are subject to corrosion Some microstructured surfaces are opaque to electromagnetic radiation. This limitation precludes their use with transparent media. Most of the aforementioned dry processes rely on a dynamic method of forming microstructures during the step of film deposition, which necessarily involves either multiple deposition parameters that can be difficult to control in practice or non-equilibrium growth mechanisms that are unpredictable. In addition, many of the dry or wet chemical processes are suitable for imparting microstructures to only relatively small surface areas during a given time period due to limitations of available equipment.

SUMMARY OF THE INVENTION

In one aspect, this invention provides articles comprising a substrate and, overlying the surface of said substrate, a microlayer which comprises an array of discrete, uniformly oriented, with respect to the substrate surface, crystalline, solid, organic microstructures (or microelements), e.g. in the form of whiskers. Preferably, the microstructures are of uniform shape and size, and comprise single crystals having cross-sectional dimensions less than the wavelength of visible light. The microstructures are densely arrayed, and the microlayer, which has a high specific surface area, can be produced on a wide variety of substrates by means of a simple process, without being restricted to a small surface area.

In another aspect, this invention involves a process for making the said articles comprising the steps of (1) depositing a vapor of an organic substance as a thin, continuous film onto a substrate to provide a composite, and (2) annealing, i.e. heating, the composite in a vacuum sufficiently such that a physical change is induced in the deposited film to form said microstructures. The aspect ratio of the microstructures can be controlled by varying the thickness of the film formed in the first step of the process. Optionally, a third step involves coating the resultant annealed article with a coating material to impart a desired property thereto, such as low reflectivity, i.e. light trapping.

Organic substances that are useful for preparing the microstructured surfaces of this invention include compounds having planar molecules comprising chains or rings, preferably rings, over which $\pi$-electron density is extensively delocalized. These compounds include polynuclear aromatic hydrocarbons, such as perylenes, and heterocyclic aromatic compounds, such as porphyrins and phthalocyanines.

In yet another aspect, the microstructures of the surface overlying the substrate can serve in turn as another substrate which can be coated and, in turn, overcoated again. The resultant coated articles are then suitable for many forms of light trapping, energy absorption, imaging, data transmission and storage, and gradient index applications, depending on the configuration of the microstructures.

BRIEF DESCRIPTION OF THE DRAWINGS

FIG. 5 shows a transmission electron micrograph (hereinafter TEM) at 280,000× taken at normal incidence to the surface of platinum shadow-coated perylene red microstructures. The microstructures are lath shaped, with very straight edges, are uniform in cross-section along their lengths, and are uniform from microstructure to microstructure. The pattern of dots are clusters of platinum microislands vapor deposited as a coating onto the microstructures at an angle of incidence of 45°, after they were transferred to a polyvinyl formaldehyde-coated copper TEM sample grid. The platinum preferentially nucleated at defect sites on the surface of the microstructures. The platinum very clearly delineates the presence of single crystal step edges running parallel to the long dimensions of the microstructures, which indicates a high degree of crystalline perfection along the entire length of the microstructures.

DETAILED DESCRIPTION

The article of this invention comprises a substrate bearing on at least one major surface thereof a microlayer comprising an array of discrete, single- or poly-crystalline, uniformly oriented (with respect to the substrate surface) microstructures of a solid, organic material.

As used herein, the term "microstructure" means the smallest individual repeating unit of a microlayer. The term "microlayer" means the layer formed by all the microstructures taken together.

The chemical composition of the microstructures will be the same as that of the starting organic material. Organic materials that are suitable for the practice of the present invention include planar molecules comprising chains or rings over which π-electron density is extensively delocalized. Organic compounds that are suitable for use in this invention generally crystallize in a herringbone configuration. Compounds that are preferred for this invention can be broadly classified as polynuclear aromatic hydrocarbons and heterocyclic compounds. Polynuclear aromatic compounds are described in Morrison and Boyd, *Organic Chemistry*, Third Edition, Allyn and Bacon, Inc. (Boston: 1974), Chapter 30, and heterocyclic aromatic compounds are described in Morrison and Boyd, *supra*, Chapter 31. Among the classes of polynuclear aromatic hydrocarbons preferred for this invention are naphthalenes, phenanthrenes, perylenes, anthracenes, coronenes, pyrenes, and derivatives of the compounds in the aforementioned classes. A preferred organic material is commercially available perylene red pigment, N,N'-di(3,5-xylyl)perylene-3,4:9,10 bis(dicarboximide), hereinafter referred to as perylene red. Among the classes of heterocyclic aromatic compounds preferred for this invention are phthalocyanines, porphyrins, carbazoles, purines, pterins, and derivatives of the compounds in the aforementioned classes. Representative examples of phthalocyanines especially useful for this invention are phthalocyanine and its metal complexes, e.g. copper phthalocyanine. A representative example of porphyrins useful for this invention is porphyrin. The organic materials are preferably capable of forming an initially continuous film of a thickness of at least several hundred Angstroms to a few thousand Angstroms.

Each individual microstructure is single- or poly-crystalline rather than amorphous. The thin film microlayer is highly anisotropic due to the crystalline nature and uniform orientation of the microstructures.

The orientation of the microstructures in relation to the surface of the substrate is generally uniform. As used herein, the term "uniform", with respect to orientation, means that the angles between an imaginary line perpendicular to the surface of the substrate and the major axes of at least 90% of the microstructures varies no more than approximately 5° from the mean value of the aforementioned angles. The microstructures are usually oriented perpendicular or normal to the substrate surface, the surface normal direction being defined as that direction of the line perpendicular to an imaginary plane lying tangent to the local substrate surface at the point of contact of the base of the microstructure with the substrate surface. The surface normal direction is thus seen to follow the contours of the surface of the substrate. Surface normal-oriented microstructures render the microlayer capable of a high level of light trapping arising from multiple scattering of incident light between the surfaces of the individual microstructures.

The size, i.e. length and cross-sectional area, of the microstructures are generally uniform from microstructure to microstructure. As used herein, the term "uniform", with respect to size, means that the major dimension of the cross-section of the individual microstructures varies no more than about 23% from the mean value of the major dimension and the minor dimension of the cross-section of the individual microstructures varies no more than about 28% from the mean value of the minor dimension. The uniformity of the microstructures provides uniformity in properties, and performance, of articles containing the microlayer. Such properties include optical, electrical, and magnetic properties. For example, electromagnetic wave absorption, scattering, and trapping are highly dependent upon uniformity of the microlayer.

Although microstructures can have varieties of shapes, in any one given microlayer, the shapes of the individual microstructures are preferably uniform. Shapes include rods, cones, cylinders, and laths. In the preferred embodiment, the microstructures are lath-shaped whiskers. The microstructures can have a large aspect ratio, generally ranging from about 10 to about 100. As used herein, the term "aspect ratio", with respect to a microstructure, means the ratio of the length (major dimension) to the diameter or width (minor dimension) of the microstructure. Furthermore, it is relatively simple to control the aspect ratio by specifying the thickness of the initially deposited organic film. One advantage of being able to control the aspect ratio is that the microlayer can be given variable anisotropic optical properties tailored for a desired function. The major dimension of the microstructures is directly proportional to the thickness of the initially deposited film. Because it is clear that all the original organic film material is being converted to microstructures, and because the microstructures have uniform cross-sectional dimensions, are discrete, and are separated by distances on the order of their width, conservation of mass implies the lengths of the microstructures will be proportional to the initially deposited film thickness. Hence the lengths and aspect ratios of the microstructures can be varied independently of their cross-sectional dimensions and areal densities. As used herein, "areal density" means the number of microstructures grown per unit area. For example, it has been found that length of microstructures are approximately ten times ($10\times$) the thickness of a vapor deposited film, when the thickness ranges from about 0.05 to about 0.2 micrometers. The minor dimension of the microstructures is determined by the surface free energy ratios of the bounding crystallographic side planes and can be explained by Wulff's theorem. The surface area of the microlayer of the article of this invention, i.e. the sum of the surface areas of the individual microstructures, is much greater than that of the organic film initially deposited on the substrate. This feature allows the article to function effectively as a light trapping medium.

The spectral absorption characteristics of the microstructures are substantially similar to those of the starting organic material, unless they are overcoated. The index of refraction of the microstructures will be intermediate between that of a solid film of the organic material and that of the surrounding medium, due to the discrete nature of the microstructures; that is, there is a gradient index of the type described in Lee and Debe, "Measurement and Modeling of the Reflectance-Reducing Properties of Gradient Index Microstructured Surfaces", Photographic Science and Engineering, Vol. 24, No. 4, July/August 1980, pp. 211–216.

Substrates that are useful in the practice of this invention can be selected from those materials which will maintain their integrity at the temperatures and vacuums imposed upon them during the vapor deposition and annealing steps. The substrate can be flexible or rigid, planar or non-planar, convex, concave, aspheric, or combinations thereof. Materials such as ceramics, e.g. glass, metal, metal oxides, or their mixtures can be used as substrates. Organic, polymeric materials able to withstand annealing temperatures can also be used. Representative examples of metals useful as substrates for this invention include aluminum, cobalt, copper, molybdenum, nickel, platinum, and tantalum. The varying nature of metals or metal oxides brings about no observable differences in the final composite, i.e., both the pure metals and metals having oxide coatings serve as inert substrates. Metal substrates can thus be exposed to the atmosphere before coating a film of organic material thereon without adverse affects. Thickness of the substrate can vary.

Figure 1:
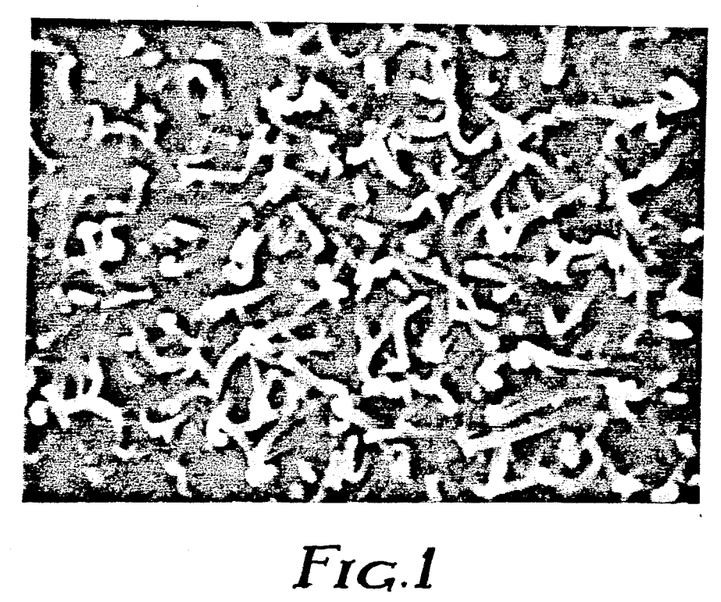
FIG. 1 shows a scanning electron micrograph (hereinafter SEM) at 30,000 magnification (30,000×) taken at normal incidence to the microlayer of a perylene red film that had first been vapor deposited onto an aluminum substrate and then vacuum annealed.
Figure 2:
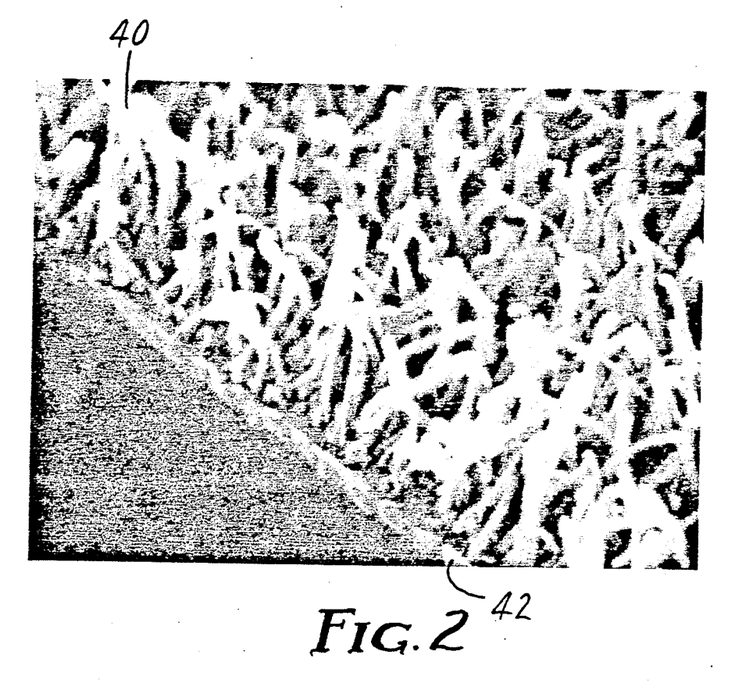
FIG. 2 shows a SEM at 30,000× of the microlayer of FIG. 1 taken at an angle of incidence of 45° to the composite surface. The whisker-shaped microstructures are about 1.5 micrometers long, uniform in cross-section along their lengths, discrete, non-contacting, and oriented substantially perpendicular to the substrate, which is made of aluminum. (Variations from the perpendicular were induced by the act of preparing the microstructures for the photomicrograph.) The microstructures appear to have a round cross-section because of the limiting resolution of the scanning electron microscope.

A surface microlayer such as that depicted in FIGS. 1 and 2 can be formed according to the following procedure. A clean metal substrate is prepared by either vacuum vapor depositing or ion sputter depositing a metal film onto a previously cleaned float glass slide. Suitable metals are those that are useful for preparing substrates, as noted previously. The thickness of the metal film is preferably on the order of 1000 Angstroms. Other materials useful for forming the substrate are bare float glass and standard laboratory microscope slides cleaned according to usual laboratory procedures. The substrate can be coated with the layer of organic material by depositing by means of physical vacuum vapor deposition, i.e. sublimation of the organic material under an applied vacuum. The temperature of the substrate during vapor deposition is not critical and the temperature range chosen can be varied, depending upon the organic material selected. For perylene red, a substrate temperature near room temperature (25° C.) is satisfactory. The rate of vacuum vapor deposition can be varied. Thickness of the layer of organic material deposited can vary and the thickness chosen will determine the major dimension of the resultant microstructures after the annealing step is performed. Layer thicknesses in the range of 0.05 to 0.25 micrometers are generally preferred.

Figure 10:
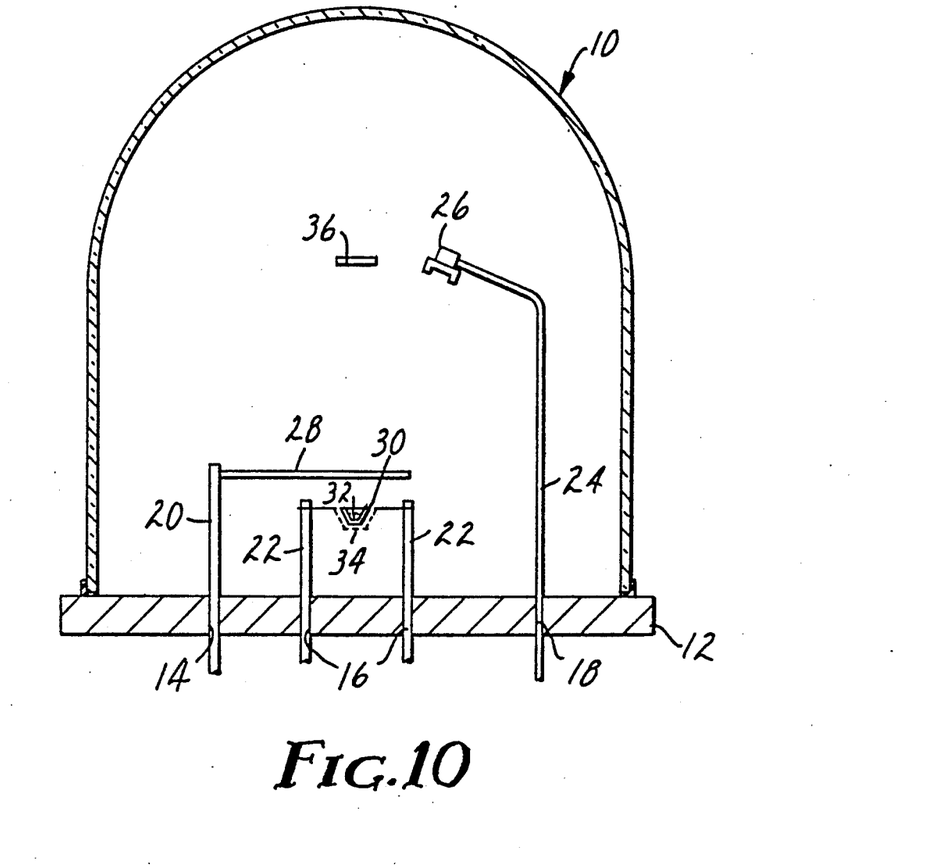
FIG. 10 shows a schematic diagram of a vacuum deposition apparatus that can be used in the first step of the process of this invention.

A typical apparatus for conducting vacuum vapor deposition is shown schematically in FIG. 10 and comprises a bell jar 10, a vacuum base plate 12 with ports 14, 16, 18 for rotary motion means 20, electrical power means 22, and water cooling means 24, respectively, quartz crystal thin film deposition monitor 26, a shutter 28 operated by the rotary motion means 20, a crucible 30 for the organic source material 32, a tungsten wire basket 34 for supporting and resistively heating the crucible 30. These apparatus are known to those of ordinary skill in the art and are commercially available.

Electrical power can be used to heat an alumina or quartz source crucible 30 containing the organic material 32 to be vapor deposited. The means for providing rotational motion 20 allows moving a shutter 28, so as to either interrupt or permit the deposition of the organic material 32 onto the substrate 36, which is mounted above the source crucible 30.

The substrate 36, such as previously described, is placed in the vacuum bell jar 10 to which is attached a liquid nitrogen trapped, oil diffusion pump (not shown). The substrate 36 is positioned, metal side down, above the source crucible 30 within the bell jar 10. The distance from the substrate 36 to the source crucible 30 will affect the deposition rate and the film thickness. A typical distance is approximately 16.5 cm. The crucible 30 is first cleaned by heating it empty to glowing red temperatures under vacuum. The organic material 32, e.g. perylene red, is placed in the bottom of the crucible 30 to a depth of about 2 mm and gently tapped down to eliminate air pockets. After evacuating the bell jar 10 to a pressure below $1\times10^{-6}$ Torr, the crucible 30 is heated to 260° C. for 30 minutes as a "pre-soak" to degas the organic material 32. A movable shutter 28 between the source crucible 30 and substrate 36 should remain closed during the pre-soak phase. The pre-soak step is then continued at about 285° C. for an additional 45 minutes. During this time the system pressure is maintained at ca. $8 \times 10^{-7}$ Torr. Heating current to the tungsten basket 34 holding the source crucible 30 is then increased to bring the crucible temperature to 380° C. to 420° C. After 3½ minutes, the shutter 28 is opened, allowing the organic material to sublime and deposit on the substrate. At any given crucible temperature, the deposition rate is greatest when the organic material 32 uniformly wets the interior of the crucible 30 and is prevented from forming an iris-like deposit on the top rim of the crucible by uniform heating. Deposition rates typically vary from 20 Angstroms per minute to 400 Angstroms per minutes and film thicknesses typically range from 500 to 2000 Angstroms, but these parameters can vary widely. During vapor deposition, no special means need be used to control the substrate temperature. It is typically found that the temperature of the metallized glass slide increases 10° to 15° C. above ambient during vapor deposition.

The rate of sublimation, and consequently, thickness of the organic film layer deposited on the substrate 36 can be determined by the use of a quartz crystal oscillator thin film deposition monitor 26. Such monitors are commercially available and are well known in the art.

In the annealing step, the coated substrate from the vapor deposition step is heated in a vacuum for a sufficient period of time such that the deposited film layer undergoes a physical change resulting in production of a microlayer comprising pure, single- or poly-crystalline microstructures. Exposure of the organic material coated substrate to the atmosphere before the annealing step is not detrimental to subsequent microstructure formation.

In the annealing step for films of perylene red and copper phthalocyanine, the coated substrate can be heated by any suitable means (not shown) in a vacuum (not shown) of at least moderate quality, e.g., $1 \times 10^{-3}$ Torr or lower, and in a temperature range of 160° C. to 230° C. The time of annealing is dependent on the annealing temperature but a range of about ½ to about 6 hours, preferably about 1½ to about 4 hours, is generally sufficient to convert the original organic film layer on the substrate to the microstructured film, as can be determined by scanning electron microscopy and reflection absorption infrared spectroscopy (see M. K. Debe, Appl. Surface Sci., 14 (1982-83) pp. 1-40).

The interval between the vapor deposition step and the annealing step can vary from several minutes to several months, with no significant adverse effect, as long as the coated composite is stored in a covered container. However, the length of the interval is not critical. The annealing step can be monitored in situ with either an infrared spectroscopic technique (see FIG. 4), or the reflectance of a He-Ne laser beam at near grazing incidence. As the microstructures develop, the infrared band intensities change and the laser specular reflectivity drops, thus allowing the conversion to be carefully followed. The substrate is allowed to undergo a natural, unaided cooling before the vacuum chamber is backfilled with a gas (e.g., air) to attain atmospheric pressure and the substrate removed from the vacuum chamber.

Only controlled vacuum deposition and vacuum annealing are necessary to generate the articles of this invention. Heretofore, microstructured surfaces have required vacuum processes such as plasma, sputter, or reactive ion etching, or non-vacuum processes such as chemical etching, electro- or electroless deposition, anodizing, and etching for their production. Furthermore, the composition of the microstructures heretofore were amorphous or polycrystalline oxides, alloys, or other polymeric forms which lacked the oriented, pure crystalline properties of the articles of this invention.

Other embodiments of this invention include articles that can be made by processes comprising additional coating of the articles obtained from the annealing step.

"Coating" means that another material, organic, or inorganic, is either (a) put in intimate contact with the microstructures of the annealed article, or (b) applied as an overlayer to 'blanket' the annealed article. In the first case, the coating can come in intimate contact with essentially the entire surface of the microstructure. Furthermore, this coating may or may not be a continuous film, depending on the microstructures and overall microlayer. In the second case, the coating comes in contact primarily with the tips or distal ends of the microstructures so as to provide a continuous film. The successive overcoating of a previously coated article is also within the purview of this invention.

The coating of the annealed article is preferably done by a vacuum deposition process to avoid the disturbance of the microstructures by mechanical-like forces of contact. This vacuum deposited coating can serve to strengthen the microlayer and permit further overcoating by means of the vacuum deposition technique described in this invention or by means of conventional coating techniques such as dipping, spraying, roll coating, knife, blade coating, and the like. Overcoating the coated and annealed articles with organic or inorganic materials can provide an overcoat as continuous or discontinuous films, depending upon the microlayer of the coated article.

Marked changes in the resultant coated article can be noted. For example, coating an annealed article with copper provides a black composite of low specular reflectivity and changed microlayer. Polyethylene overcoating of an annealed article, previously coated with copper, provides a composite with secondary microtextured surface having different physical and chemical properties, the details of which are described in the examples.

The articles of this invention are useful for many forms of light trapping, energy absorption, imaging, data transmission and storage and gradient index applications. The articles of this invention can be used to prepare photovoltaic devices, such as the type of device described in U.S. Pat. No. 4,252,865, radiation absorbing devices, e.g. selective solar absorbers, flat plate solar collectors, solar absorption panels, such as the type of device described in U.S. Pat. No. 4,148,294, solar cells, such as the type of device described in U.S. Pat. No. 4,155,781, photo absorbing surfaces, such as the type of device described in U.S. Pat. No. 4,209,008, optical storage media, such as the type of device described in "Textured surfaces: Optical Storage and Other Applications", H. G. Craighead, R. E. Howard, J. E. Sweeney, and D. M. Tennant, J. Vac. Sci. Technol., 20(3, Mar. 1982.

This invention is further illustrated by the following, non-limiting examples.

EXAMPLE 1

This example involves an article comprising an aluminum substrate that bears on the surface thereof a microlayer of perylene red. A substrate was formed by vacuum sputter depositing an aluminum film onto a 3 mm×30 mm×10 cm glass slide. The aluminum film was allowed to air oxidize by natural exposure to the atmosphere. Then, the aluminum coated glass slide was installed in a vacuum bell jar to which was attached a liquid nitrogen trap and diffusion pump capable of attaining vacuums in the range of about $1 \times 10^{-7}$ Torr. Approximately 0.1 gram of commercially available perylene red was placed in an alumina crucible, which was in turn heated by a tungsten basket heater in the vacuum bell jar. The perylene red was vacuum purified by degassing it during a "pre-soak" heating period, during which time the crucible was maintained at 260° C. to 385° C. for over 2 hours. A shutter positioned between the crucible and the aluminum coated glass slide, and located 16.5 cm (6.5 inches) above the source crucible, was kept closed during the pre-soak period. Immediately prior to the start of deposition of perylene red onto the aluminized substrate, the electrical power applied to the crucible heating basket was increased to cause the interior crucible temperature to exceed 380° C., thus initiating sublimation of the perylene red.

Figure 3:
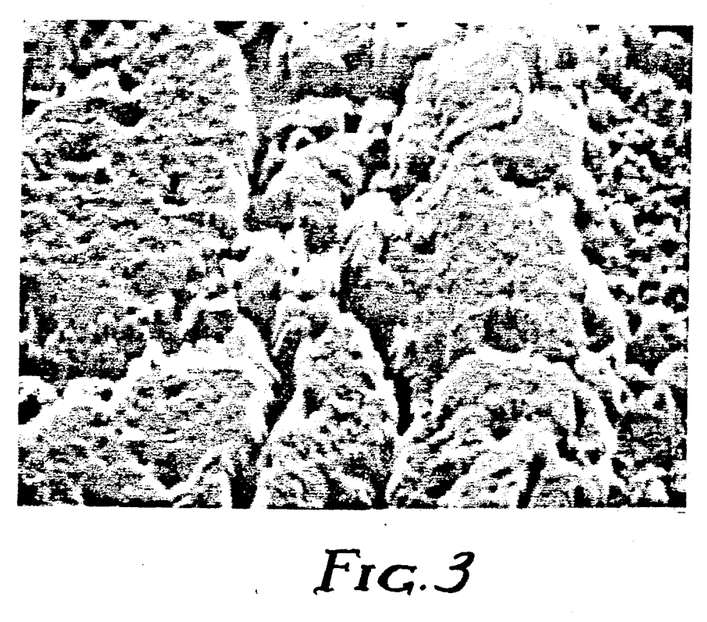
FIG. 3 shows a SEM at 30,000× taken al an angle of incidence of 45° to the composite surface of a rough portion of the initial perylene red film that had been vapor deposited on an aluminum substrate, but not vacuum annealed.

The sublimation rate of the perylene red was monitored with a quartz crystal oscillator thin film deposition monitor. The shutter was opened to allow the perylene red vapor to deposit on the surface of the aluminum substrate and thin film monitor. The perylene red film was allowed to form on the aluminum substrate to a total thickness of 0.15 micrometers before the shutter was closed. During the deposition, the aluminized substrate temperature was not actively controlled but varied between 25° to 40° C. FIG. 3 shows an SEM micrograph of a rough portion of the as-deposited film, which, after the annealing step resulted in the microstructured surface (see FIGS. 1 and 2).

Figure 4:
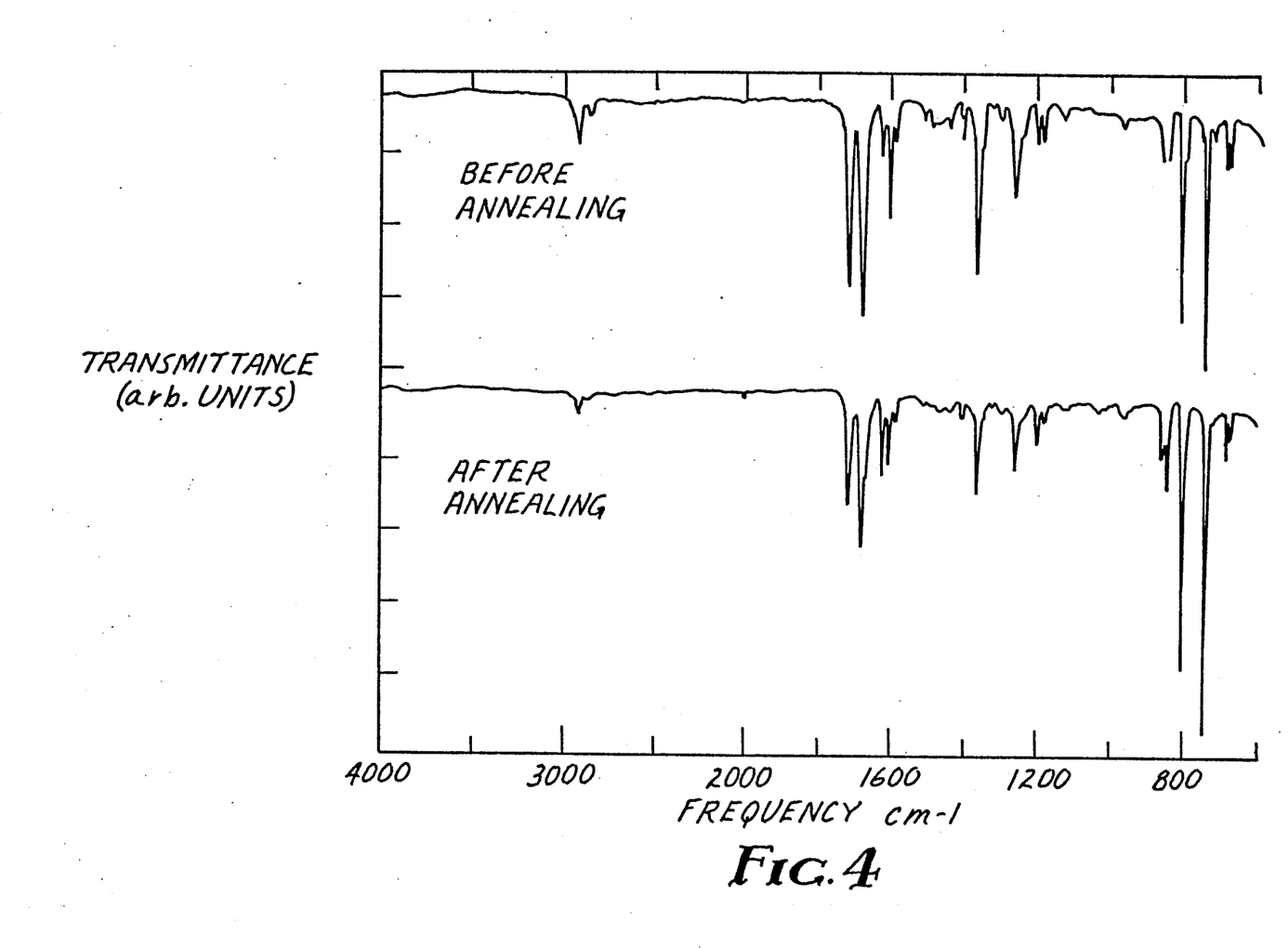
FIG. 4 is an infrared (IR) transmittance spectra taken in an external reflectance configuration demonstrating IR absorption band intensity changes that can be used to monitor the growth of microstructures and indicate degree of completeness of microstructure growth.

The aluminized glass composite, bearing a 1500 Angstrom thick film of perylene red, was removed from the bell jar system, and inserted into a second similar vacuum bell jar equipped with a heater assembly capable of heating the entire continuous perylene red-coated surface of the composite by thermal conduction through the 3 mm thick glass substrate. The perylene red composite was heated at approximately 190° C. over a period of several hours while the annealing step was continuously monitored, with the technique of reflection absorption infrared spectroscopy (RAIR) to measure the phase transition growth of the microstructures. FIG. 4 shows the observed infrared spectral changes that occurred in the composite before and after the formation of microstructures. The significant relative band intensity changes are indicative of the occurrence of preferential orienting of perylene red molecules relative to the aluminum substrate.

Figure 5:
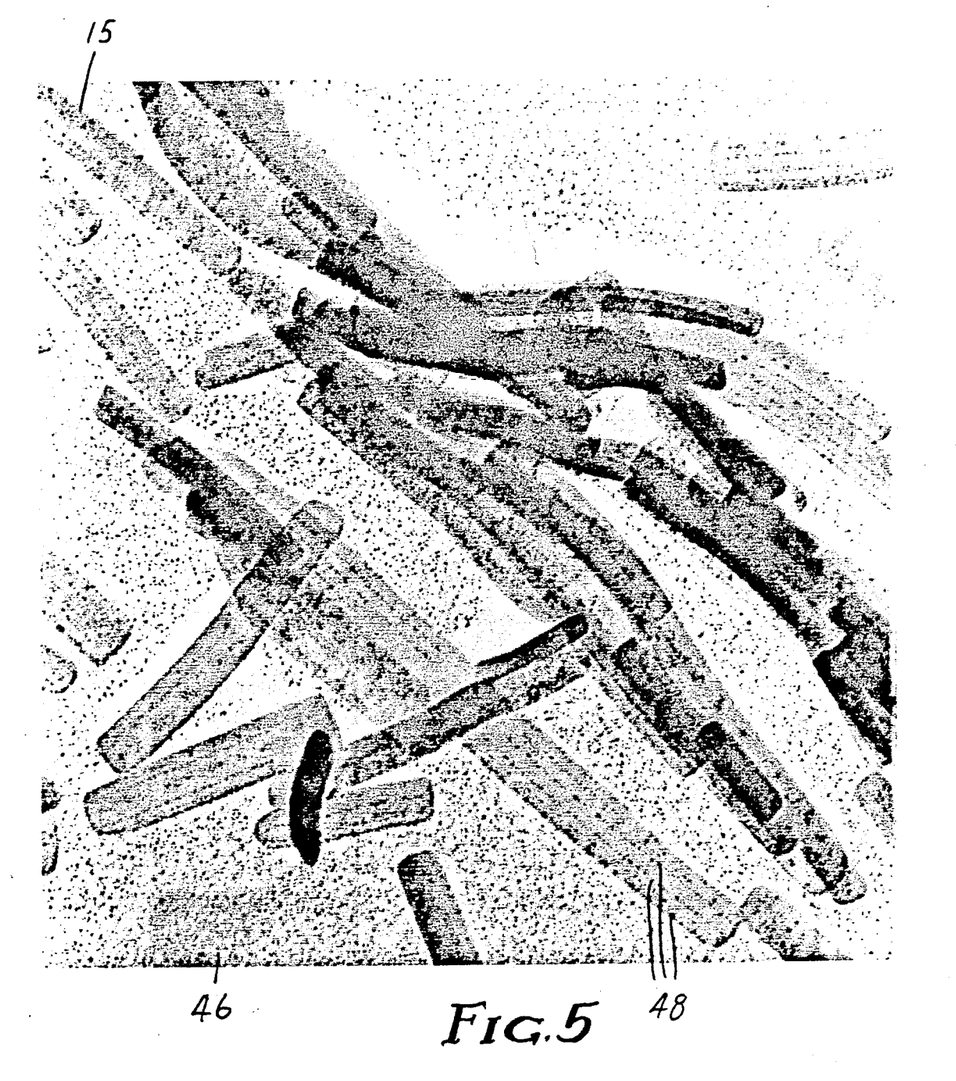

Microstructures 40 (see FIG. 2) are seen to be about 1.5 micrometers in length, oriented substantially perpendicular to the aluminum film substrate 42, and, as may be deduced from inspection of FIG. 1, have areal number densities on the order of 50 per square micrometer. Microstructures 40 appear to have uniform cross-sectional dimensions along their lengths, and though touching at times at their bases, are essentially discrete and non-contacting. While they appear to have a round cross-section in FIGS. 1 and 2, due to limited resolution of the SEM, the microstructures actually are lath shaped, as shown in FIG. 5. Microstructures 44 in the TEM image are seen to have very straight sides and are exceptionally uniform in cross-section along their lengths. The pattern of dots 46 are clusters of platinum microislands that were vapor deposited onto the microstructures after the latter were mechanically removed from the substrate by rubbing and transferred to a Formvar® brand polyvinylformaldehyde plastic coated TEM sample grid. The platinum preferentially nucleates at defect sites on the surfaces of the microstructures and very clearly delineates the presence of step edges 48 running parallel to the major dimension the microstructures (see FIG. 5), indicating a high degree of crystalline perfection along the entire length of the microstructure.

Microstructures of perylene red produced by the process of this invention are single- or polycrystalline, have a cubic lattice structure and [211] growth axis standing substantially normal to the surface of the substrate. Cross-sectional dimensions of perylene red microstructures are uniform along their lengths and display a narrow size distribution from microstructure to microstructure. The width of perylene red microstructures is 0.052 micrometers on average and their thickness is 0.027 micrometers on average. Side planes of perylene red microstructures have (001) and (111) crystal indices. When the initially deposited film is fully converted to the microstructure form, the individual, oriented microstructures are discrete, essentially non-touching at their base (i.e., the point of contact of the microstructure with the substrate), and are densely arrayed with mean spacings on the order of 0.05 micrometers, giving areal number densities of about 5 billion microelements per square centimeter or 50 microelements per square micrometer. Average length of the microstructures depends on the initial uniform film thickness, and is approximately 10 to 15 times this initial value. Aspect ratios are typically in the range of 10 to 80 or the initial thickness range above and an order of magnitude increase in specific surface area.

EXAMPLE 2

This example involves another embodiment of this invention, wherein the microlayer of a microstructured article made according to the method of Example 1 was coated with copper metal.

Figure 6:
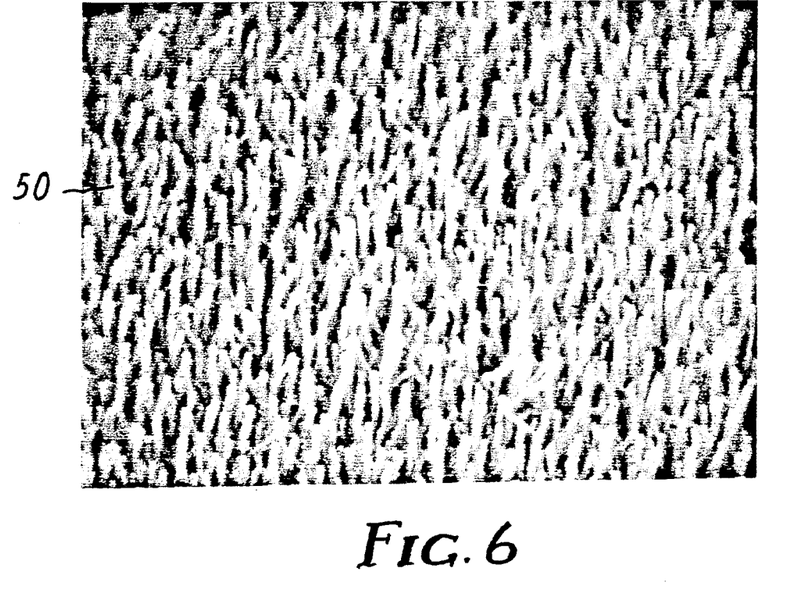
FIG. 6 shows a SEM at 10,000× taken at an angle of incidence of 45° wherein a mass equivalent of 500 Angstroms of copper was coated by sputter deposition onto the microstructures. The coated article provided a very efficient light-trapping or absorbing surface, and, accordingly, appeared very black.
Figure 7:
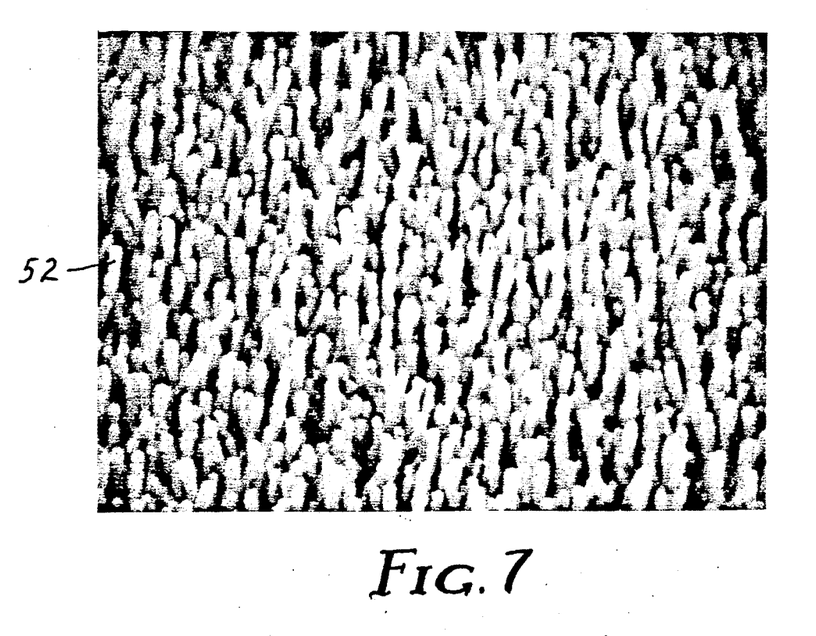
FIG. 7 shows a SEM at 10,000× taken al an angle of incidence of 45° wherein a mass equivalent of 1000 Angstroms of copper was coated by sputter deposition onto the microstructures. The surface of the coated article appeared dark gray. The surface had an extraordinarily low specular reflectivity.
Figure 8:
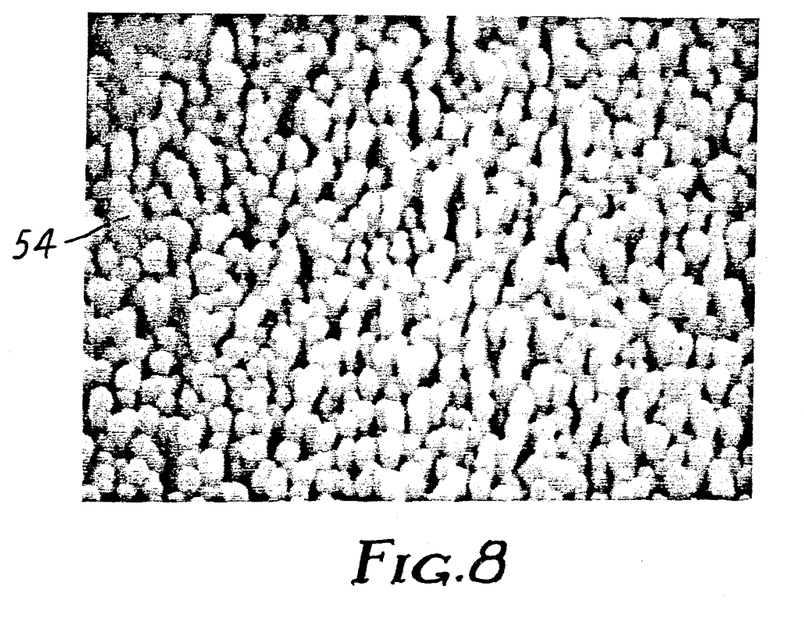
FIG. 8 shows a SEM at about 10,000× taken at an angle of incidence of 45° wherein a mass equivalent of 2000 Angstroms of copper was coated by sputter deposition onto the microstructures. The surface of the coated article appeared light gray. The surface had an extraordinarily low specular reflectivity. The scale of the microlayer was seen to change on account of the increase in epitaxial metal growth on the sides of the microstructures.

A mass equivalent of 500 Angstroms of copper was ion sputter deposited onto the microstructures 50 of the article made according to Example 1 (see FIG. 6); this amount was increased to 1000 Angstroms for microstructures 52 (see FIG. 7) and 2000 Angstroms for microstructures 54 (see FIG. 8). Metal coated microstructures 50 provide a very efficient light trapping surface and accordingly appear very black. The metal coated microstructures 52 and 54 caused the surface to appear dark gray and light gray respectively, and provided the surface with an extraordinarily low specular reflectivity. The microlayer scale was seen to change as the dimensions of the microstructures changed because of the epitaxial metal growth on the sides of the microstructures.

EXAMPLE 3

Figure 9:
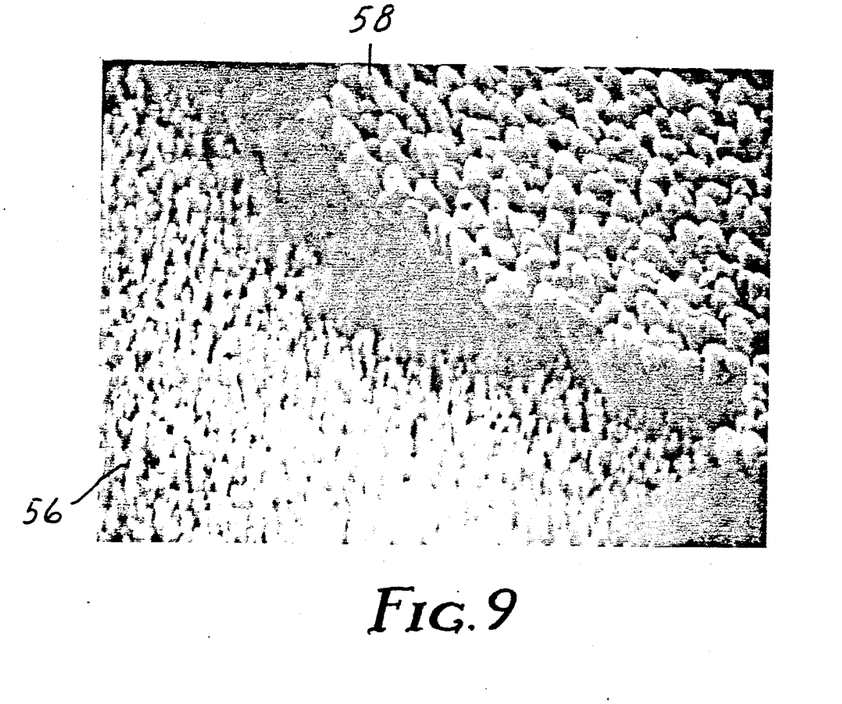
FIG. 9 shows a SEM at about 5,000× taken at an angle of incidence of 45° showing a vapor deposited polyethylene film deposited as an overcoating over a perylene red microlayer after the perylene red microstructures had been previously sputter coated with 500 Angstroms of copper. A portion of the polyethylene overcoating was stripped away to reveal the underlying copper metallized microstructures.

This example involves another embodiment of this invention wherein a 500 Angstrom coating of copper metal, which had been previously sputter-coated onto a microstructured article made according to Example 1, is overcoated with a film of polyethylene by means of vacuum vapor deposition (see FIG. 9).

The polyethylene was deposited onto the copper coated article to a thickness substantially greater than the length of the major dimension of the microstructures 56, so as to generate a new microtextured surface of much larger scale and different chemical nature. The polymer overcoating may also serve as a protective coating for the underlying microstructured surface.

EXAMPLE 4

This example involves an article having copper deposited as a coating onto a microstructured article made according to Example 1, wherein a platinum substrate had first been deposited onto a glass slide by vapor deposition.

As described in Example 1, a glass slide sputter coated with platinum, was coated by means of vapor deposition with perylene red to a thickness of 1650 Angstroms at a mean deposition rate of 410 Angstroms per minute. The annealing step was carried out by heating the sample at gradually incremented temperatures in the range of ca. 165° to 205° C. The annealing step was monitored with IR spectroscopy until the band intensities became constant with time, i.e. stabilized.

In another vacuum system, copper was then ion sputter coated onto the microstructured surface of the article in an argon atmosphere at a pressure of 5 mTorr and 500 watts output power from a 13.6 megaHertz RF power supply. The article was masked so as to produce three areas of increasing thickness of the copper coating, which was calibrated to be equivalent to uniform film thicknesses of 500, 1000 and 2000 Angstroms, respectively. After the coating step was complete, the sample region having a 500 Angstrom layer of sputtered copper appeared jet black in ordinary light due to the high light trapping properties of the region. The region having a 1000 Angstrom layer of copper appeared dark gray and the region having a 2000 Angstrom layer appeared light gray. It was also observed that the particular thickness of metal coating needed to produce a desired level of grayness depended on the metal used.

Metal coaled microstructures of this invention had an extremely low specular reflectivity. For example, the specular reflectivity of the sample region having 1000 Angstrom thick layer of copper was measured at 7.5° off normal incidence and found to be less than 1.5% between wavelengths of 2500 nm and 2000 nm, and below 0.5% between wavelengths of 2000 nm and 185 nm, relative to an aluminum reference mirror. This ability to go from a surface characterizable a having low specular and low diffuse reflectivity to one of low specular and high diffuse reflectivity by simply doubling the thickness of metal coating on the microstructures is considered an important aspect of this invention.

EXAMPLE 5

In this example, the metal-coated article prepared in Example 2 was overcoated, by vacuum vapor coating, with a non-conductive, polymeric material, namely polyethylene. Commercially available polyethylene pellets, were inserted into a quartz tube, approximately 13.3 cm (5.25 inches) long and 0.95 cm (0.375 inches) in diameter, having a 0.16 cm by 8.26 cm slot cut longitudinally on one side of the tube. The tube was placed in a vacuum bell jar and heated by passing current through a nichrome film previously sputter coated on the outside surface of the quartz tube. The ends of the quartz tube were blocked with quartz plugs. The slot was oriented upward in the vacuum bell jar and parallel to the long axis of the metal-coated microstructured article, which was positioned approximately 3.8 cm. (1.5 inches) above the quartz tube. The quartz tube was heated by dissipating ca. 9 watts of power for 16 minutes in the nichrome film, which caused a film of polyethylene to be vapor coated onto the metal coated microstructures of the composite. FIG. 9 shows an SEM micrograph of the sample, at a point where the overcoated polyethylene 58 was stripped away, revealing the underlying metal coated microstructures 56 in a region where 500 Angstrom thick layer of copper had been deposited A SEM micrograph of the underside of the stripped away polyethylene overlayer revealed a multiplicity of hemispherical depressions where the distal ends (rounded 'heads') of the copper-coated microstructures had been partially embedded in the polyethylene overlayer. The visual effect of the polyethylene was to reduce even further the specular and diffuse reflectivity of the surface. For example, the region with the 1000 Angstrom thick layer of copper and polymeric coating, discussed in Example 4 above, was now measured to have a specular reflectivity at 7.5° off normal incidence of only 0.9% at a wavelength of 2500 nm, reducing to 0.1% at wavelengths between 2000 nm and 900 nm, and 0.3% at a wavelength of 850 nm.

EXAMPLE 6

This example demonstrates generation of a microlayer wherein the organic material is a porphyrin.

Metal-free phthalocyanine was deposited onto an aluminized glass substrate, according to procedure of Example 1. The thickness of the organic layer was 500 Angstroms, the deposition rate was 45 Angstroms per minute, and the background pressure was ca. $2 \times 10^{-6}$ Torr. The resulting composite was installed into a second vacuum chamber and annealed at a pressure of $4 \times 10^{-8}$ Torr by gradually increasing the film temperature in steps to a maximum of approximaely 190° C. over a period of $2\frac{1}{2}$ hours. Heating was stopped when the maximum temperature was reached. Scanning electron micrographs of the resulting surface showed an array of crystalline, whisker-shaped microstructures, having a uniform cross-section, approximately square-shaped, each side of the square being approximately 500 Angstroms. The microstructures were oriented essentially perpendicular to the surface of the substrate, and they had an aspect ratio in the range of 5 to 10. The number of microstructures per unit area was not as high as that for the perylene red material in the previous examples, probably due to premature stoppage of the annealing.

A second sample of the same organic material was deposited and annealed in the same manner as was the first sample, the only differences being that the layer of organic material was 900 Angstroms thick, and the annealing was maintained above ca 180° C. to 200° C. for over two hours. During the two hour period at elevated temperature, some of the material desorbed, but the material remaining on the cooler edges of the sample displayed the same oriented crystalline microstructures as seen on the previously described 500 Angstrom sample. The microstructures were slightly longer and the areal number density was slightly higher, being about 5 microstructures per square micrometer.

Various modifications and alterations of this invention will become apparent to those skilled in the art without departing from the scope and spirit of this invention, and it should be understood that this invention is not to be unduly limited to the illustrative embodiments set forth herein.

What is claimed is:

1. Method for preparing an article comprising a substrate bearing on at least one major surface thereof a microlayer comprising an array of discrete, uniformly oriented, crystalline, solid microstructures, said microstructures comprising an organic compound wherein the molecule thereof is planar and comprises chains or rings over which $\pi$-electron density is extensively delocalized, said method comprising the steps of:

(1) providing said substrate, (2) vapor-depositing said organic compound on said substrate, and (3) annealing the substrate and the deposited organic compound of step (2) at a temperature in the range of from 165° C. to about 230° C. for a period of time of from about ½ to about 6 hours in a vacuum lower than about $1 \times 10^{-3}$ Torr to form said microlayer.

2. The method of claim 1 further including the step of depositing onto the microstructures of the microlayer of step (3) a layer of organic or inorganic material to form a topcoat.

3. The method of claim 2 further including the step of overcoating said topcoat with a layer of organic or inorganic material.

UNITED STATES PATENT AND TRADEMARK OFFICE
CERTIFICATE OF CORRECTION

PATENT NO. : 5,039,561
DATED : August 13, 1991
INVENTOR(S) : Debe

It is certified that error appears in the above-indentified patent and that said Letters Patent is hereby corrected as shown below:

Col. 1, line 36, "chemical)" should be --chemical--.

Col. 1, line 49, "corrosion" should be --corrosion.--.

Col. 2, line 59, "al" should be --at--.

Col. 3, line 25, "al" should be --at--.

Col. 10, line 36, "or" should be --for--.

Col. 11, line 39, "coaled" should be --coated--.

Col. 11, line 47, "a" should be --as--.

Col. 12, line 10, "deposited" should be --deposited.--.

Signed and Sealed this

Twenty-fifth Day of October, 1994

Attest:

BRUCE LEHMAN

Attesting Officer

Commissioner of Patents and Trademarks